(12) United States Patent
Dong et al.

(10) Patent No.: US 11,664,078 B2
(45) Date of Patent: May 30, 2023

(54) NEGATIVE GATE STRESS OPERATION IN MULTI-PASS PROGRAMMING AND MEMORY DEVICE THEREOF

(71) Applicant: YANGTZE MEMORY TECHNOLOGIES CO., LTD., Wuhan (CN)

(72) Inventors: Zhipeng Dong, Wuhan (CN); Li Xiang, Wuhan (CN); Haiwen Fang, Wuhan (CN); Min Zhang, Wuhan (CN); Ling Chu, Wuhan (CN); Haibo Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 133 days.

(21) Appl. No.: 17/232,052

(22) Filed: Apr. 15, 2021

(65) Prior Publication Data

US 2022/0310181 A1    Sep. 29, 2022

Related U.S. Application Data

(63) Continuation of application No. PCT/CN2021/083509, filed on Mar. 29, 2021.

(51) Int. Cl.
*G11C 11/34* (2006.01)
*G11C 16/34* (2006.01)
(Continued)

(52) U.S. Cl.
CPC ...... *G11C 16/3459* (2013.01); *G11C 16/0433* (2013.01); *G11C 16/08* (2013.01);
(Continued)

(58) Field of Classification Search
CPC ............ G11C 16/3454; G11C 16/3459; G11C 11/5628; G11C 16/0483; G11C 2211/5621
(Continued)

(56) References Cited

U.S. PATENT DOCUMENTS

| 6,834,012 B1 * | 12/2004 | He ..................... G11C 16/3404 365/185.29 |
| 10,026,486 B1 | 7/2018 | Dutta et al. |

(Continued)

OTHER PUBLICATIONS

International Search Report issued in corresponding International Application No. PCT/CN2021/083509, dated Jan. 5, 2022, 4 pages.
(Continued)

*Primary Examiner* — Son T Dinh
(74) *Attorney, Agent, or Firm* — Bayes PLLC

(57) ABSTRACT

A memory device is provided. The memory device includes an array of memory cells arranged in a plurality of rows, a plurality of word lines respectively coupled to the plurality of rows of the memory cells; and a peripheral circuit coupled to the word lines and configured to perform multi-pass programming on a selected row of memory cells coupled to a selected word line of the word lines. The multi-pass programming includes a plurality of programming passes, each of the programming passes having a programming operation and a verify operation. To perform the multi-pass programming, the peripheral circuit is configured to, in a non-last programming pass, perform a negative gate stress (NGS) operation on each memory cell in the selected row of memory cells between the programming operation and the verify operation.

20 Claims, 12 Drawing Sheets

(51) Int. Cl.
*G11C 16/04* (2006.01)
*G11C 16/08* (2006.01)
*G11C 16/10* (2006.01)
*G11C 16/24* (2006.01)
*G11C 16/26* (2006.01)
*G11C 16/30* (2006.01)

(52) U.S. Cl.
CPC ............ *G11C 16/102* (2013.01); *G11C 16/24* (2013.01); *G11C 16/26* (2013.01); *G11C 16/30* (2013.01)

(58) Field of Classification Search
USPC .......................... 365/185.18, 185.22, 189.16
See application file for complete search history.

(56) References Cited

U.S. PATENT DOCUMENTS

| | | |
|---|---|---|
| 2008/0279012 A1 | 11/2008 | Lee |
| 2010/0246259 A1 | 9/2010 | Kwon |
| 2012/0051138 A1 | 3/2012 | Kim et al. |
| 2016/0260485 A1 | 9/2016 | Jung |

OTHER PUBLICATIONS

International Search Report issued in corresponding International Application No. PCT/CN2021/083511, dated Jan. 5, 2022, 4 pages.

\* cited by examiner

800

```
┌─────────────────────────────────────────────────────────┐
│  PERFORM A NON-LAST PROGRAMMING PASS ON A SELECTED      │─── 802
│  WORD LINE, THE NON-LAST PROGRAMMING PASS INCLUDING ONE │
│  OR MORE PROGRAM LOOPS, AT LEAST ONE OF THE PROGRAM     │
│  LOOPS INCLUDING A PROGRAMMING OPERATION, A NGS         │
│  OPERATION, AND A VERIFY OPERATION                      │
└─────────────────────────────────────────────────────────┘
                            │
                            ▼
┌─────────────────────────────────────────────────────────┐
│  PERFORM A LAST PROGRAMMING ON THE SELECTED WORD LINE,  │─── 804
│  THE LAST PROGRAMMING PASS INCLUDING ONE OR MORE        │
│  PROGRAM LOOPS, THE PROGRAM LOOPS INHIBITING NGS        │
│  OPERATION ON ALL MEMORY CELLS OR ENABLING NGS          │
│  OPERATIONS ON MEMORY CELLS THAT DID NOT PASS VERIFY    │
│  OPERATIONS                                             │
└─────────────────────────────────────────────────────────┘
```

FIG. 8

NEGATIVE GATE STRESS OPERATION IN MULTI-PASS PROGRAMMING AND MEMORY DEVICE THEREOF

CROSS-REFERENCE TO RELATED APPLICATIONS

This application is continuation of International Application No. PCT/CN2021/083509, filed on Mar. 29, 2021, entitled "NEGATIVE GATE STRESS OPERATION IN MULTI-PASS PROGRAMMING AND MEMORY DEVICE THEREOF," which is hereby incorporated by reference in its entirety. This application is also related to U.S. application Ser. No. 17/232,059, filed on Apr. 15, 2021, entitled "NEGATIVE GATE STRESS OPERATION IN MULTI-PASS PROGRAMMING AND MEMORY DEVICE THEREOF," which is hereby incorporated by reference in its entirety.

BACKGROUND

The present disclosure relates to memory devices and operations thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, a program operation can be performed at the page level, and a read operation can be performed at the cell level.

SUMMARY

In one aspect, a memory device includes an array of memory cells arranged in a plurality of rows, a plurality of word lines respectively coupled to the plurality of rows of the memory cells, and a peripheral circuit coupled to the word lines and configured to perform multi-pass programming on a selected row of memory cells coupled to a selected word line of the word lines. The multi-pass programming includes a plurality of programming passes. Each of the programming passes includes a programming operation and a verify operation. To perform the multi-pass programming, the peripheral circuit is configured to, in a non-last programming pass, perform a NGS operation on each memory cell in the selected row of memory cells between the programming operation and the verify operation.

In another aspect, a method for operating a memory device is provided. The memory device has an array of memory cells arranged in a plurality of rows and a plurality of word lines respectively coupled to the plurality of rows of the memory cells. The method includes performing multi-pass programming on a selected row of memory cells, the multi-pass programming comprising a plurality of programming passes. Each of the programming passes includes a programming operation and a verify operation. Performing the multi-pass programming includes, in a non-last programming pass, performing a NGS operation on each memory cell in the selected row of memory cells between the programming operation and the verify operation.

In still another aspect, a system includes a memory device configured to store data and a memory controller coupled to the memory device and configured to control the memory device. The memory device includes an array of memory cells arranged in a plurality of rows, a plurality of word lines respectively coupled to the plurality of rows of the memory cells, and a peripheral circuit coupled to the word lines and configured to perform multi-pass programming on a selected row of memory cells coupled to a selected word line of the word lines. The multi-pass programming includes a plurality of programming passes. Each of the programming passes includes a programming operation and a verify operation. To perform the multi-pass programming, the peripheral circuit is configured to, in a non-last programming pass, perform a NGS operation on each memory cell in the selected row of memory cells between the programming operation and the verify operation.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

FIG. 8 illustrates a flowchart of an exemplary method for performing multi-pass programming on a selected row of memory cells, according to some aspects of the present disclosure.

Figure 1A:
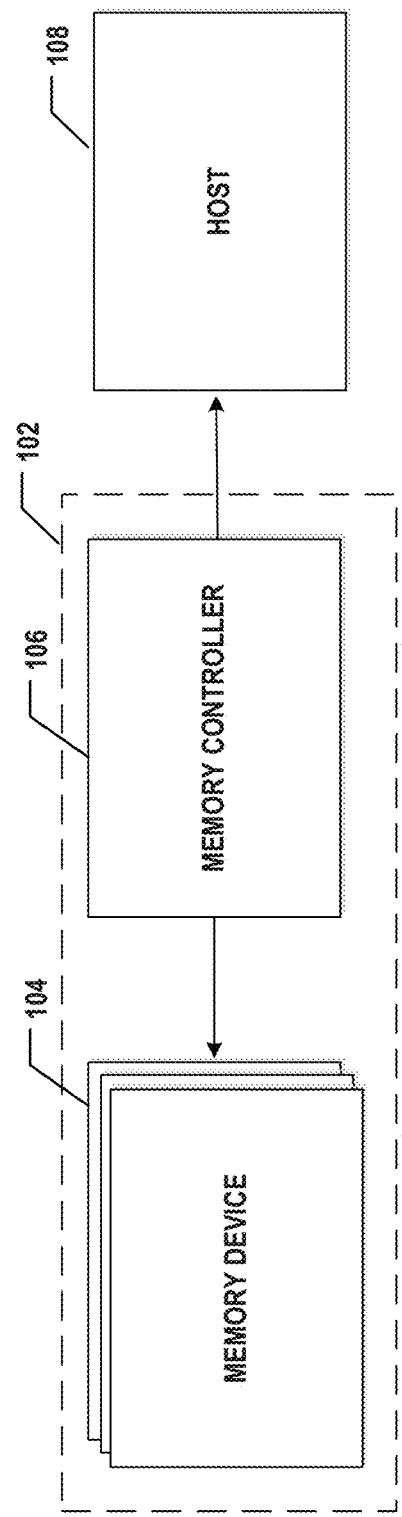
FIG. 1A illustrates a block diagram of an exemplary system having a memory device, according to some aspects of the present disclosure.

Aspects of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

Charge-trapping material has been used for retention of data in a NAND Flash memory. For example, a charge-trapping material can be used in a charge-trapping layer in a NAND memory string (e.g., memory channel). However, a charge-trapping device, e.g., a memory device having a charge-trapping layer for data retention, can have reliability issues due to the nature of the charge-trapping material.

A common issue of a charge-trapping device is known as a fast initial charge loss (or early retention) issue, which is a fast relaxation behavior in which charges escape from the charge-trapping layer shortly after a programming operation. This behavior is believed to cause by the shallowly-trapped charges and can result in a threshold voltage of a memory cell to drift. The drifting of the threshold voltage can lead to degraded programming distributions.

In a NAND Flash memory, the intersections of word lines and strings form a plurality of memory cells. The block includes a plurality of fingers, and each finger includes a pair of fingers. Each string is coupled to a bit line. Strings in a finger are coupled to a drain select gate (DSG). A memory cell stores data in the form of a threshold voltage, which represents the lowest voltage at which the memory cell can be switched on. For example, the threshold voltage range of a 2-bit multi-level cell (MLC) NAND Flash memory cell is divided into four regions. The region in which the threshold voltage of a memory cell falls represents the memory cell's current state, which can be an erased (or ER) state and three higher data states. A programming pass may use a set of increasing program voltages/pulses which are applied on the word line coupled to a memory cell to program the memory cell by setting the threshold voltage of the memory cell to the desired states. Each program voltage/pulse is applied in a programming operation and is followed by a verify operation, which employs one or more verify voltages to determine whether the memory cell has completed programming. After all the memory cells are programmed, the data in the memory cells can be read back in a read operation.

Multi-pass programming can be used in programming memory cells. In multi-pass programming, multiple programming passes are employed consecutively. Multi-pass programming can reduce neighboring word line interference (NWI), which refers to an increase in the threshold voltage of a memory cell connected to one word line when the neighboring (adjacent) memory cells (e.g., in the same string and coupled to other word lines) are programmed. Multi-pass programming can reduce the NWI by programming the memory cells to intermediate threshold voltage distributions in non-last programming pass(es), and programming the memory cells to the final threshold voltage distribution in the last programming pass.

As mentioned above, shallowly-trapped charges may cause programming distribution to degrade. To solve the issue of degraded programming distribution, a negative gate stress (NGS) operation has been used in the multi-pass programming to remove at least some shallowly-trapped charges and tighten the threshold voltage distribution. However, a NGS operation may decrease a read window budget (RWB), i.e., a threshold voltage window between erased and higher data states needed for reading operation of a memory cell, and is thus not suitable to be enabled on a memory cell after the memory cell already passes a verify operation. In a NGS operation, memory cells passed the verify operation immediately prior to the NGS operation, and memory cells not passed the verify operation immediately prior to the NGS operation are applied with different combinations of voltages such that the memory cells passed the verify operation would not undergo the NGS operation and only the memory cells not passed the verify operation would undergo the NGS operation. For example, when programming memory cells row by row, different voltages are applied on the DSGs and bit lines coupled to memory cells (e.g., in the same row) passed and not passed the verify operation, respectively, such that only the memory cells not passed the verify operation undergo NGS operations. The operation of the NAND memory can be complex, and the power consumption of the operation can be undesirably high. Sometimes, the distributions of the threshold voltage of memory cells that have already undergone a NGS operation are not desirably narrow, impacting the reading operation.

The present disclosure provides a novel NGS scheme for multi-pass programming in a memory device, the memory device, and a system thereof. The NGS scheme is enabled in at least one non-last programming pass of the multi-pass programming to remove shallowly-trapped charges in memory cells passed and not passed a respective verify operation immediately-prior to the NGS operation. Different from the known NGS scheme, which is only enabled on memory cells not passed a respective verify operation, the novel NGS scheme is enabled on all memory cells in a selected row that are being programmed. That is, memory cells, passed and not passed the respective verify operation, may each undergo a respective NGS operation. The NGS operations can further remove the shallowly-trapped charges in the memory cells that have already passed the respective verify operation, and further narrow the distributions of threshold voltage, increasing the RWB. In the last programming pass of the multi-pass programming, when a selected row of memory cells are being programmed, NGS operations are only enabled on memory cells not passed a respective verify operation immediately prior to the NGS operation or not enabled on any memory cells. The RWB of a memory cell thus would not be decreased by NGS operations.

To enable NGS operations on each memory cells in a selected row that is being programmed, a same low voltage may be applied on the DSGs of all the strings in which all the memory cells in the selected row are located. The DSGs of these strings are thus turned off. Meanwhile, source-select gates (SSGs) of all these strings are also turned off. A relatively high positive voltage, e.g., higher than $V_{DD}$, is applied on word lines above and below the word line coupled to the memory cells in the selected row, boosting the voltage potential of the strings. The strings are thus each in a floating state, and the potential in the string increases. A low voltage is applied on the word line coupled to the selected row of memory cells such that a NGS operation can be enabled in each of the memory cells in the row. This can enable "an erase" of the shallowly-trapped charges such that each memory cell in the selected row can have the shallowly-trapped charges further removed. To avoid the decrease of RWB of the memory cells, the novel NGS scheme is enabled in a non-last programming pass. In some implementations, because a low voltage, e.g., ground or a negative voltage, is applied on the DSGs of all the strings being programmed, the power consumption can be reduced.

FIG. 1A illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1A, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive the data to or from memory devices 104.

Memory device 104 can be any memory devices disclosed herein, such as a NAND Flash memory device. Consistent with the scope of the present disclosure, memory controller 106 may control the multi-pass programming on memory device 104 such that a NGS operation is enabled on all memory cells, even those passed the respective verify operations, in a non-last programming pass of the multi-pass programming. The peripheral circuits, such as the word line drivers, may apply a low voltage, e.g., ground (GND) voltage, on the DSGs of each memory string coupled to the selected word line, and may apply a low or negative voltage on the selected word line to enable a NGS operation on all memory cells coupled to the selected word line during a non-last programming pass.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, programming memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial- ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 1C:
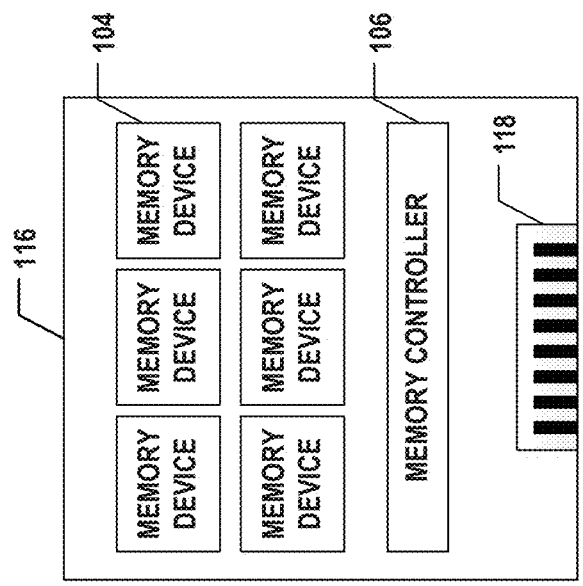
FIG. 1C illustrates a diagram of an exemplary solid-state drive (SSD) having a memory device, according to some aspects of the present disclosure.
Figure 1B:
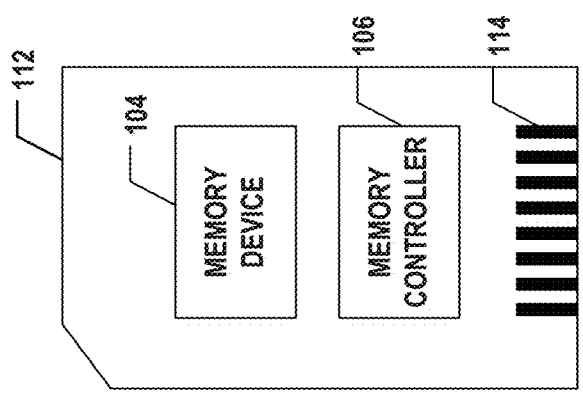
FIG. 1B illustrates a diagram of an exemplary memory card having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 1B, memory controller 106 and a single memory device 104 may be integrated into a memory card 112. Memory card 112 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 112 can further include a memory card connector 114 coupling memory card 112 with a host (e.g., host 108 in FIG. 1A). In another example as shown in FIG. 1C, memory controller 106 and multiple memory devices 104 may be integrated into an SSD 116. SSD 116 can further include an SSD connector 118 coupling SSD 116 with a host (e.g., host 108 in FIG. 1A). In some implementations, the storage capacity and/or the operation speed of SSD 116 is greater than those of memory card 112.

Figure 2:
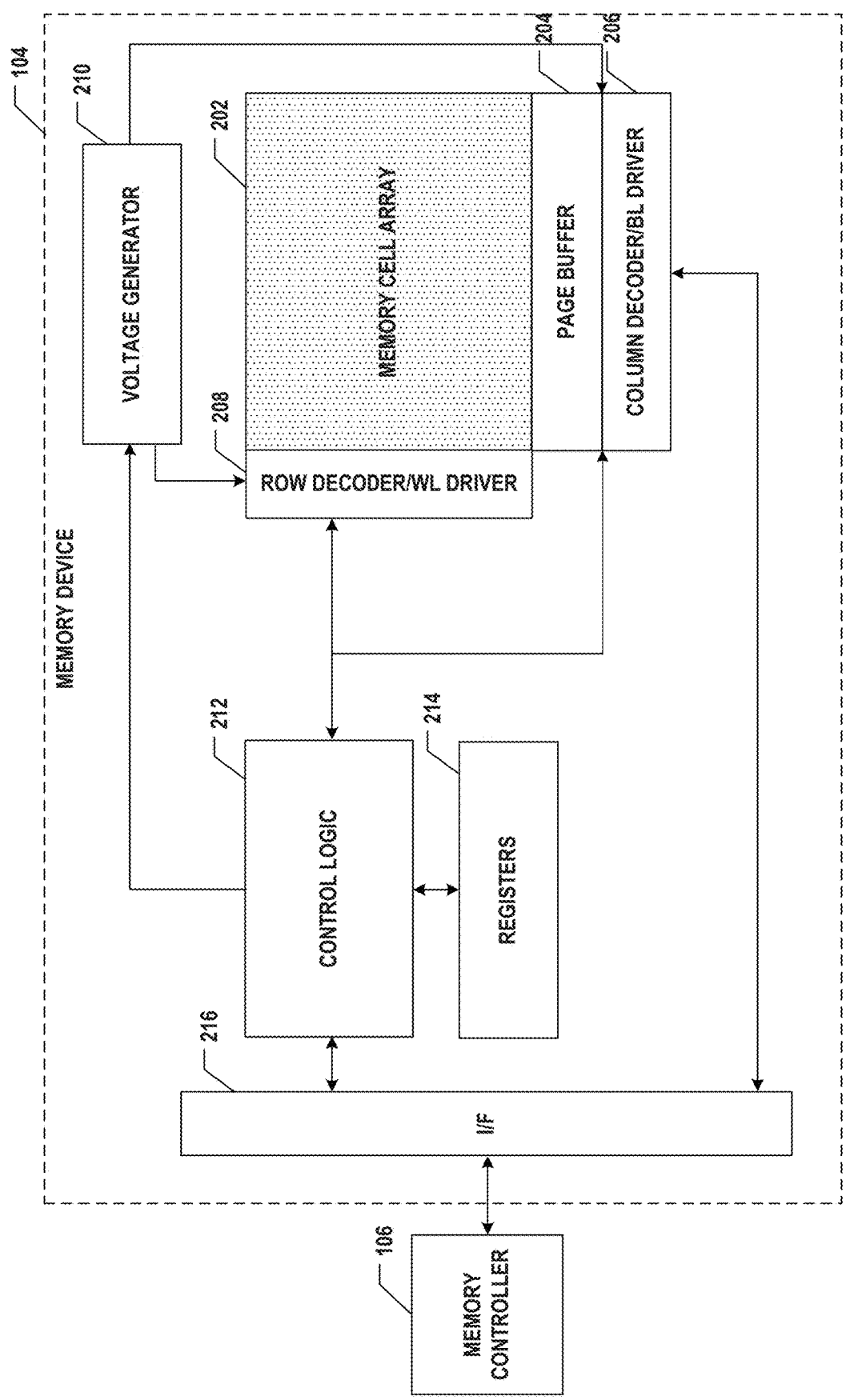
FIG. 2 illustrates a block diagram of an exemplary memory device including a memory cell array and peripheral circuits, according to some aspects of the present disclosure.
Figure 3:
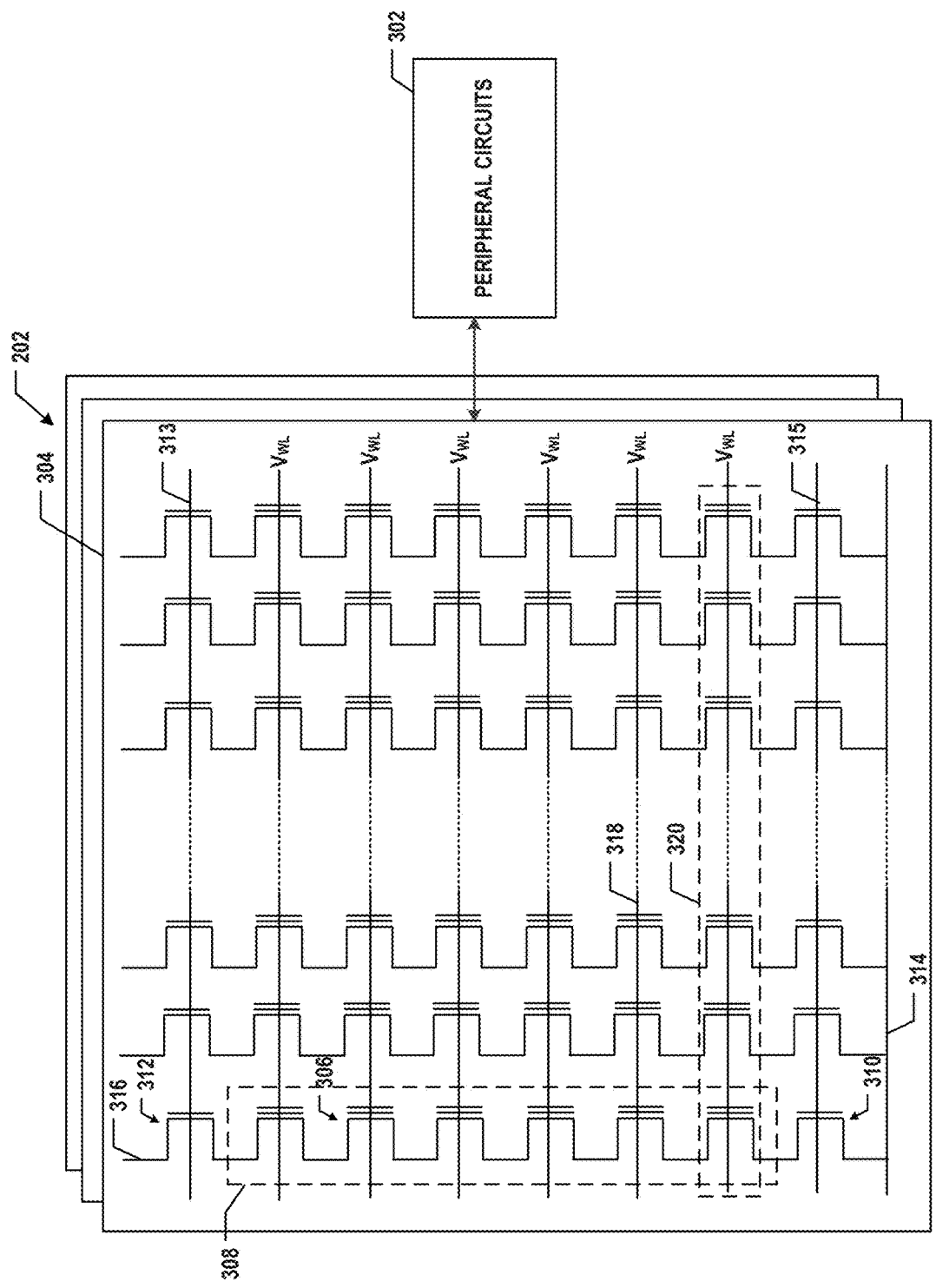
FIG. 3 illustrates a schematic circuit diagram of an exemplary memory device including peripheral circuits, according to some aspects of the present disclosure.

FIG. 2 illustrates a diagram of an exemplary memory device 104, e.g., a NAND Flash memory, having a memory cell array 202 and peripheral circuits including a page buffer 204, a column decoder/bit line driver 206, a row decoder/word line driver 208, a voltage generator 210, control logic 212, registers 214, and an interface 216. FIG. 3 illustrates a schematic circuit diagram of an exemplary memory device 104 including a memory cell array 202 and peripheral circuits 302 coupled to memory cell array 202. For ease of illustration, some components in FIGS. 2 and 3 are described together. Peripheral circuits 302 can include page buffer 204, column decoder/bit line driver 206, row decoder/word line driver 208, voltage generator 210, control logic 212, registers 214, and interface 216 in FIG. 2. It is understood that in some examples, additional peripheral circuits may be included as well.

As shown in FIG. 3, memory cell array 202 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can include an SSG 310 at its source end and a DSG 312 at its drain end. SSG 310 and DSG 312 are respective the gate electrodes of an SSG transistor and a DSG transistor and can be configured to activate selected NAND memory strings 308 (columns of the array) during read and program operations. In some implementations, SSGs 310 of NAND memory strings 308 in the same block 304 are coupled through a same source line (SL) 314, e.g., a common SL, for example, to the ground. DSG 312 of each NAND memory string 308 is coupled to a respective bit line 316 from which data can be read via an output bus (not shown), according to some implementations. In some implementations, each NAND memory string 308 is configured to be selected or deselected by applying a select voltage (e.g., above the threshold voltage of the transistor having DSG 312) or a deselect voltage (e.g., 0 V) to respective DSG 312 through one or more DSG lines 313 and/or by applying a select voltage (e.g., above the threshold voltage of the transistor having SSG 310) or a deselect voltage (e.g., 0 V) to respective SSG 310 through one or more SSG lines 315.

As shown in FIG. 3, NAND memory strings 308 can be organized into multiple blocks 304, each of which can have a common source line 314. In some implementations, each block 304 is the basic data unit for erase operations, i.e., all memory cells 306 on the same block 304 are erased at the same time. Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can correspond to the number of NAND memory strings 308 coupled by word line 318 in one block 304. Each word line 318 can include a plurality of control gates (gate electrodes) at each memory cell 306 in respective page 320 and a gate line coupling the control gates.

Peripheral circuits 302 can be coupled to memory cell array 202 through bit lines 316, word lines 318, source lines 314, SSG lines 315, and DSG lines 313. Peripheral circuits 302 may apply voltages on bit lines 316, word lines 318, source lines 314, SSG lines 315, and DSG lines 313 to perform multi-pass programming including the proposed NGS scheme in a non-last programming pass. As described above, peripheral circuits 302 can include any suitable circuits for facilitating the operations of memory cell array 202 by applying and sensing voltage signals and/or current signals through bit lines 316 to and from each target memory cell 306 through word lines 318, source lines 314, SSG lines 315, and DSG lines 313. Peripheral circuits 302 can include various types of peripheral circuits formed using MOS technologies.

Figure 4A:
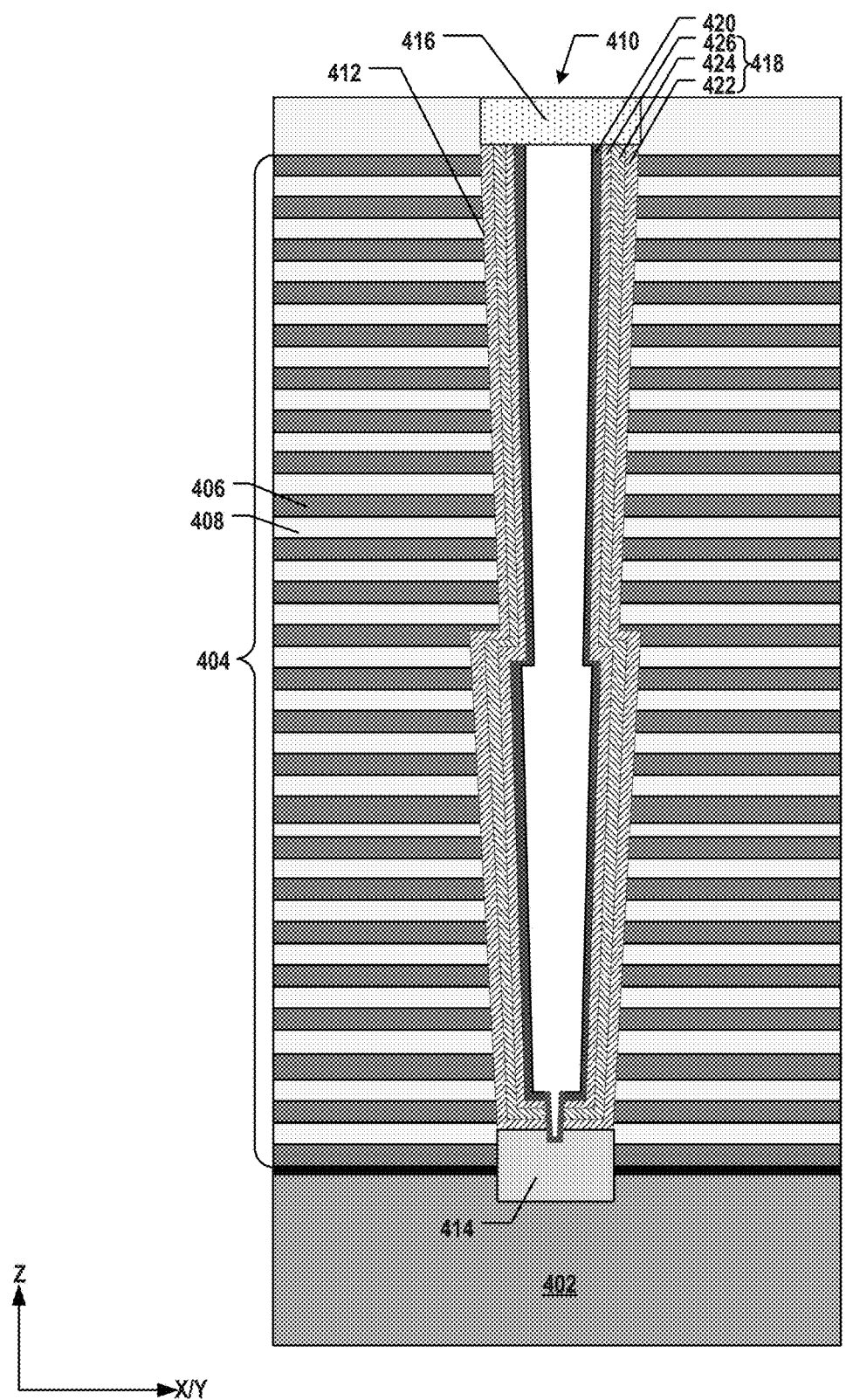
FIG. 4A illustrates a cross-section of an exemplary memory array device, according to some aspects of the present disclosure.

FIG. 4A illustrates a cross-section of an exemplary memory cell array 202, according to some aspects of the present disclosure. As shown in FIG. 4A, memory cell array 202 includes a NAND memory string 410, which can be an example of a NAND memory string 308 in FIG. 3, extending vertically above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x, y, and z axes are included in FIG. 4A to further illustrate the spatial relationship of the components in memory cell array 202. Substrate 402 includes two lateral surfaces (e.g., a top surface and a bottom surface) extending laterally in the x-direction (i.e., the lateral direction). As used herein, whether one component is "on," "above," or "below" another component of a semiconductor structure (e.g., memory cell array 202) is determined relative to the substrate of the semiconductor structure (e.g., substrate 402) in the z-direction (i.e., the vertical direction or depth direction) when the substrate is positioned in the lowest plane of the semiconductor structure in the z-direction. The same notion for describing the spatial relationship is applied throughout the present disclosure.

As shown in FIG. 4A, NAND memory string 410 extends vertically through a memory stack 404 having interleaved gate conductive layers 406 and gate-to-gate dielectric layers 408 above substrate 402. Gate conductive layers 406 and gate-to-gate dielectric layers 408 in memory stack 404 can alternate in the vertical direction. Each gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include control gates surrounding the memory cells (e.g., memory cells 306 in FIG. 3), a DSG (e.g., DSG 312 in FIG. 3), or an SSG (e.g., SSG 310 in FIG. 3), and can extend laterally as a DSG line (e.g., DSG line 313 in FIG. 3) at the top of memory stack 404, an SSG line (e.g., SSG line 315 in FIG. 3) at the bottom of memory stack 404, or a word line between the DSG line and the SSG line (e.g., word lines 318 in FIG. 3).

As shown in FIG. 4A, NAND memory string 410 includes a channel structure 412 extending vertically through memory stack 404. In some implementations, channel structure 412 includes a channel hole filled with semiconductor material(s) (e.g., as a semiconductor channel 420) and dielectric material(s) (e.g., as a memory film 418). In some implementations, semiconductor channel 420 includes silicon, such as amorphous silicon, polysilicon, or single crystalline silicon. In some implementations, memory film 418 is a composite dielectric layer including a tunneling layer 426, a storage layer 424 (also known as a "charge trap/storage layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 can include a composite layer of silicon oxide/silicon oxynitride/silicon oxide (ONO).

In some implementations, NAND memory string 410 further includes a semiconductor plug 414 in the lower portion (e.g., at the lower end) of NAND memory string 410. Semiconductor plug 414 can include a semiconductor material, such as single-crystal silicon, which is epitaxially grown from substrate 402 in any suitable direction. Semiconductor plug 414 can function as part of the channel of a source-select transistor (e.g., the source-select transistor having SSG 310 in FIG. 3) of NAND memory string 410. In some implementations, NAND memory string 410 further includes a channel plug 416 in the upper portion (e.g., at the upper end) of NAND memory string 410. In some implementations, channel plug 416 can function as the channel of a drain select transistor (e.g., the drain select transistor having DSG 312 in FIG. 3) of NAND memory string 410. As used herein, the upper end of a component (e.g., channel structure 412) is the end farther away from substrate 402 in the z-direction, and the lower end of the component (e.g., channel structure 412) is the end closer to substrate 402 in the z-direction when substrate 402 is positioned in the lowest plane of memory cell array 202.

Figure 4B:
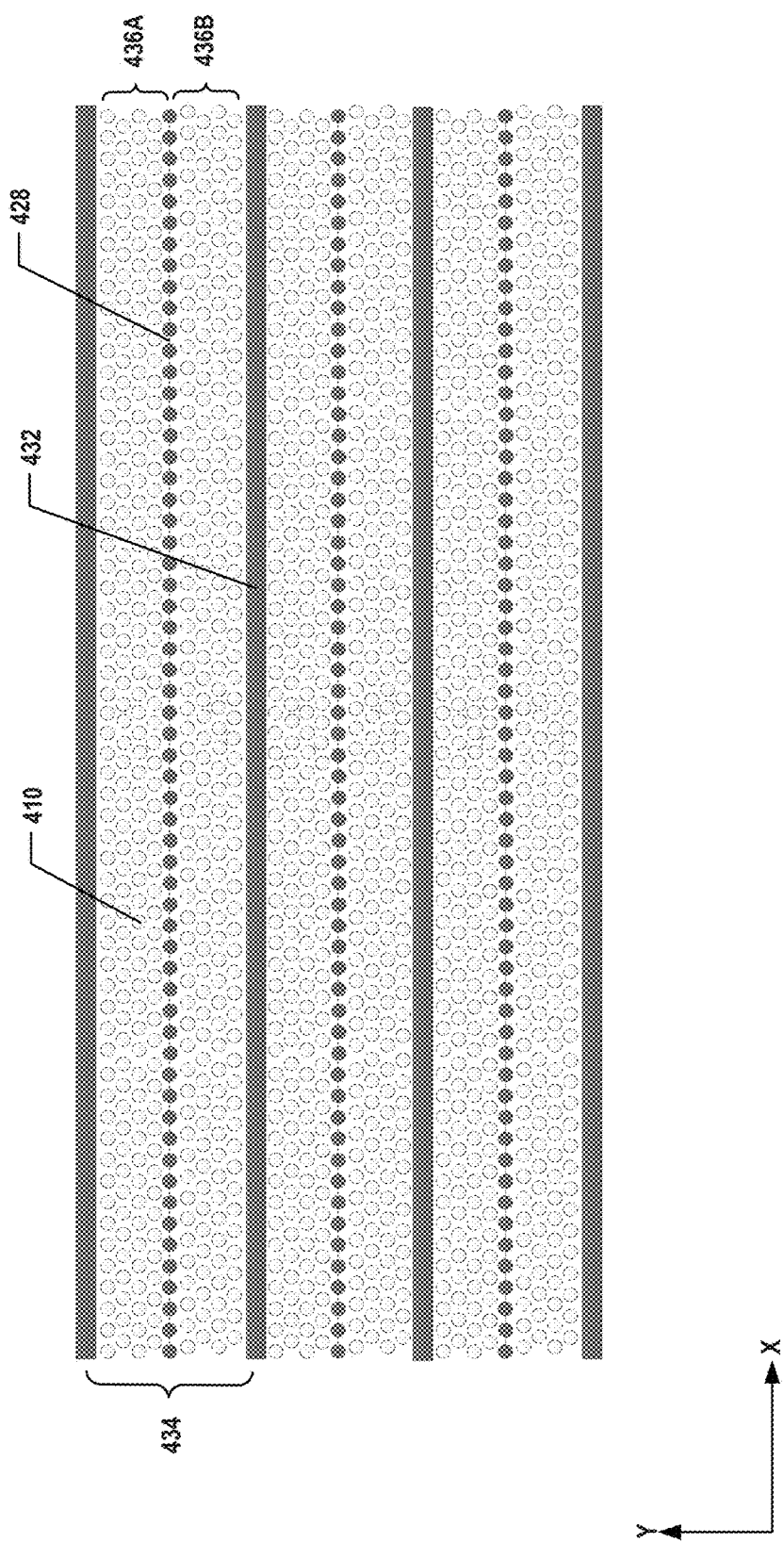
FIG. 4B illustrates a top view of a block in an exemplary memory array device, according to some aspects of the present disclosure.

FIG. 4B illustrates a top view of part of memory cell array 202, which includes a block 434 in which a plurality of NAND memory strings 410 are located, according to some implementations. Multi-pass programming may be performed to program the threshold voltages of memory cells in block 434 to higher data states. Block 434 may be an example of block 304 in memory cell array 202 illustrated in FIG. 3. As shown in FIG. 4B, in the x-y plane, block 434 is located between a pair of gate-line slits (GLSs) 432 in memory cell array 202. One or more (e.g., a pair of) GLSs 432 may further divide block 434 into a plurality of fingers 436A and 436B. A source contact (not shown) structure may be located in each GLS 432 and electrically coupled to source line 314. A DSG cut 428 may be located in the upper portion of block 434 and divide block 434 into a pair of fingers 436A and 436B. Each finger 436A/436B may include a plurality of NAND memory strings 410 arranged in the x-direction and the y-direction. In some implementations, the source contact structure each includes an insulating spacer and a conductive material in the insulating spacer. The insulating spacer may include a suitable dielectric material such as silicon oxide, and the conductive material may include W, Co, Al, Cu, polysilicon, silicides, etc. In some implementations, DSG cut 428 extends in the x-direction and includes a suitable dielectric material such as silicon oxide, silicon nitride, silicon oxynitride, or a combination thereof.

In some implementations, the same voltage is applied via a DSG line (e.g., DSG line 313) onto DSGs (e.g., DSGs 312) of NAND memory strings 410 in the same finger. In some implementations, the DSGs of NAND memory strings 410 in each finger can be separately controlled by applying a respective voltage via the respective DSG line. In a programming pass, memory cells (e.g., memory cells 306) coupled to the same word line (e.g., word line 318) in block 434 may the applied with the same programming voltage/pulse and verify voltages at the same time. In some implementations, the same voltage is applied via an SSG line (e.g., SSG line 315) onto SSGs (e.g., SSGs 310) of NAND memory strings 410 in block 434. In some implementations, each NAND memory string 410 is applied with a respective voltage via the respective bit line (e.g., bit line 316). To perform the multi-pass programming on NAND memory strings 410 in block 434, control logic 212 may control each peripheral circuit 302 to apply respective voltages. The details are illustrated as follows.

Referring back to FIG. 2, page buffer 204 can be configured to read and program data from and to memory cell array 202 according to the control of control logic 212. In one example, page buffer 204 may store one page of program data (write data) to be programmed into one page 320 of memory cell array 202. In another example, page buffer 204 also performs verify operations to ensure that the data has been properly programmed into memory cells 306 coupled to selected word lines 318.

Row decoder/word line driver 208 can be configured to be controlled by control logic 212. Row decoder/word line driver 208 may select/deselect a block 304 of memory cell array 202 and a word line 318 (page 320) of the selected block 304. Row decoder/word line driver 208 can be further configured to drive selected word line 318 using a word line voltage generated from voltage generator 210. Row decoder/word line driver 208 can also be configured to select a finger of block 304. Voltage generator 210 can be configured to be controlled by control logic 212 and generate the word line voltages (e.g., read voltage, program voltage, pass voltage, local voltage, and verification voltage) to be supplied to memory cell array 202. Column decoder/bit line driver 206 can be configured to be controlled by control logic 212 and select one or more NAND memory strings 308 by applying bit line voltages generated from voltage generator 210. For example, column decoder/bit line driver 206 may apply column signals for selecting a set of N bits of data from page buffer 204 to be outputted in a read operation.

Control logic 212 can be coupled to or deposed in each peripheral circuit 302 and configured to control operations of peripheral circuits 302. For example, control logic 212 may control peripheral circuits 302 to perform multi-pass programming, which includes the disclosed NGS scheme in a non-last programming pass. Registers 214 can be coupled to control logic 212 and include status registers, command registers, and address registers for storing status information, command operation codes (OP codes), and command addresses for controlling the operations of each peripheral circuit 302. Interface 216 can be coupled to control logic 212 and act as a control buffer to buffer and relay control commands received from a host (not shown) to control logic 212 and status information received from control logic 212 to the host. Interface 216 can also be coupled to memory controller 106 and act as an I/O interface and a data buffer to buffer and relay the program data received from memory controller 106 to control logic 212.

Figure 5A:
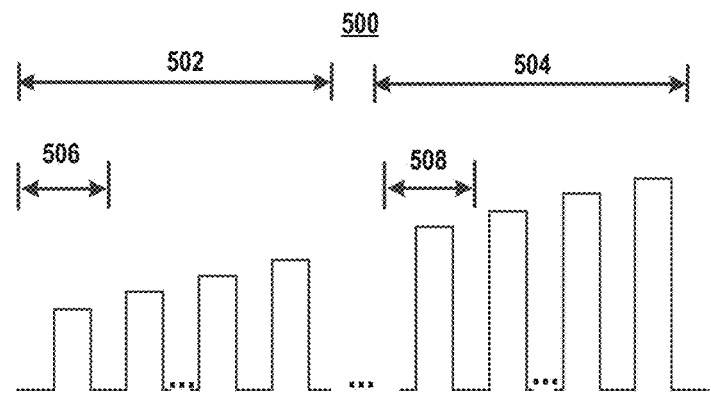
FIG. 5A illustrates a scheme of multi-pass programming for operating an exemplary memory device, according to some aspects of the present disclosure.
Figure 5B:
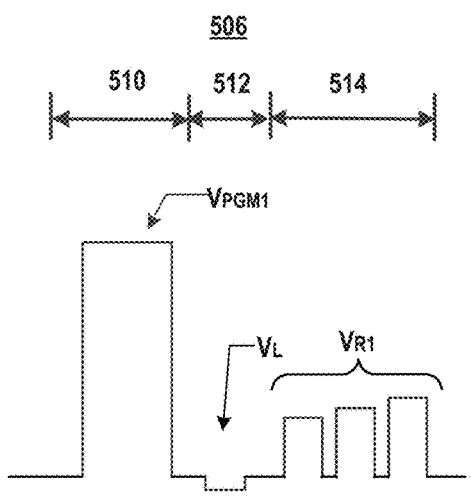
FIG. 5B illustrates a programming loop with a NGS operation, according to some aspects of the present disclosure.
Figure 5C:
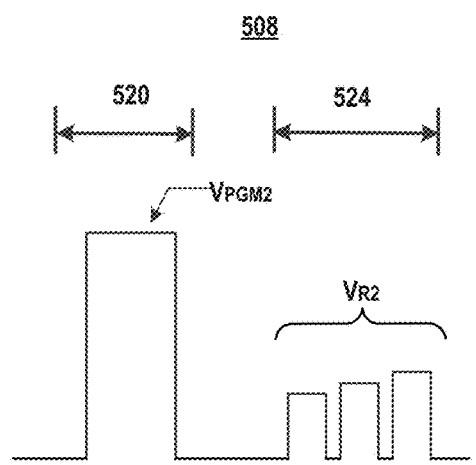
FIG. 5C illustrates a programming loop without a NGS operation, according to some aspects of the present disclosure.

FIG. 5A illustrates an exemplary multi-pass programming 500 applied on a selected word line (e.g., word line 318) of block 304 (or block 434), according to some implementations. FIG. 5B illustrates an exemplary program loop 506 including a NGS operation in a non-last programming pass 502 in multi-pass programming 500, according to some implementations. FIG. 5C illustrates an exemplary program loop 508 without a NGS operation in a last programming pass 504 in multi-pass programming 500 according to some implementations.

FIG. 5A illustrates an example of the voltages applied on memory cells coupled to a selected word line in multi-pass programming 500 via the selected word line, according to implementations of the present disclosure. Multi-pass programming 500 may include one or more non-last programming pass 502 and a last programming pass 504. For example, multi-pass programming 500 may be two-pass programming that includes a first programming/non-last pass 502 and a second/last programming pass 504. Each programming pass may include one or more program loops. For example, non-last programming pass 502 may include a plurality of program loops 506, and last programming pass 504 may include a plurality of program loops 508. Each program loop 506/508 may include a programming voltage/pulse applied by a programming operation and one or more verify voltages applied by a verify operation. The programming operation may apply programming voltage on the selected word line to program the memory cells in the selected word line into a data state. In some implementations, programming voltage increases stepwise in an amplitude in one or more program loops of a programming pass using a fixed or varying step size. In some implementations, an incremental step pulse programming (ISPP), in which programming voltage starts at an initial level and increases in a step in each successive program loop until a programming pass is completed. The verify operation may apply one or more verify voltages on the selected word line to test if the threshold voltages of the memory cells in the selected word lines have been programmed into the desired data states. It should be noted that the actual amplitudes of programming voltages and verify voltages are not limited by the implementations of the present disclosure. Although programming voltages in programming pass 504 are shown to be higher than programming voltages in programming pass 502 in FIG. 5A, depending on the operation, programming voltages in programming pass 504 may also be lower than or equal to programming voltages in programming pass 502.

FIG. 5B illustrates an example of voltages applied on the selected word line in program loop 506, according to implementations of the present disclosure. In some implementations, program loop 506 includes a programming operation 510, a NGS operation 512 following programming operation 510, and a verify operation 514 following NGS operation 512. In programming operation 510, a programming voltage $V_{PGM1}$ may be applied on the selected word line to cause the threshold voltages of the memory cells coupled to the selected word line to be assigned to the higher data states. NGS operation 512 may be subsequently enabled on all the memory cells coupled to the selected word line by applying a low voltage $V_L$ on the selected word line. Details of NGS operation 512 is described as follows in FIGS. 6A and 6B. In some implementations, verify operation 514 is performed after NGS operation 512 to test if the threshold voltages of the memory cells assigned to the higher data state reach verify voltages $V_{R1}$ (e.g., intermediate verify voltages) as shown in FIG. 5B.

FIG. 5C illustrates an example of voltages applied on the selected word line in program loop 508, according to implementations of the present disclosure. In some implementations, program loop 508 includes a programming operation 520 and a verify operation 524 following programming operation 520. No NGS operation is performed in any program loop 508 according to some implementations. In some embodiments, NGS operation is inhibited on all memory cells in program loop 508, as shown in FIG. 5C. In programming operation 520, a programming voltage $V_{PGM2}$ may be applied on the selected word line to cause the threshold voltages of the memory cells coupled to the selected word line to be assigned to the higher data states and/or have narrower distributions. In some implementations, verify operation 524 is performed after programming operation 520 to test if the threshold voltages of the memory cells assigned to the higher data state reach verify voltages $V_{R2}$ (e.g., final verify voltages) as shown in FIG. 5C. In some embodiments, although not shown, NGS operation is selectively enabled only on memory cells coupled to the selected word line and did not pass the respective verify operation immediately prior to the NGS operation.

Non-last programming pass 502 may or may not be the first programming pass in multi-pass programming 500. If non-last programming pass 502 is not the first programming pass, memory cells coupled to the selected word line may include memory cells passed the respective verify operations prior to non-last programming pass 502 and memory cells did not pass the respective verify operations prior to non-last programming pass 502. If non-last programming pass 502 is the first programming pass, all memory cells coupled to the selected word line may be treated as not passing the respective verify operations prior to non-last programming pass 502. According to the present disclosure, all memory cells coupled to the selected word line may undergo a NGS operation in non-last programming pass 502. However, in known multi-pass programming, in non-last programming pass 502, only memory cells that did not pass the respective verify operations prior to non-last programming pass 502 are selected to undergo respective NGS operations, while the NGS operations are inhibited in memory cells that passed the respective verify operations prior to non-last programming pass 502.

Figure 6A:
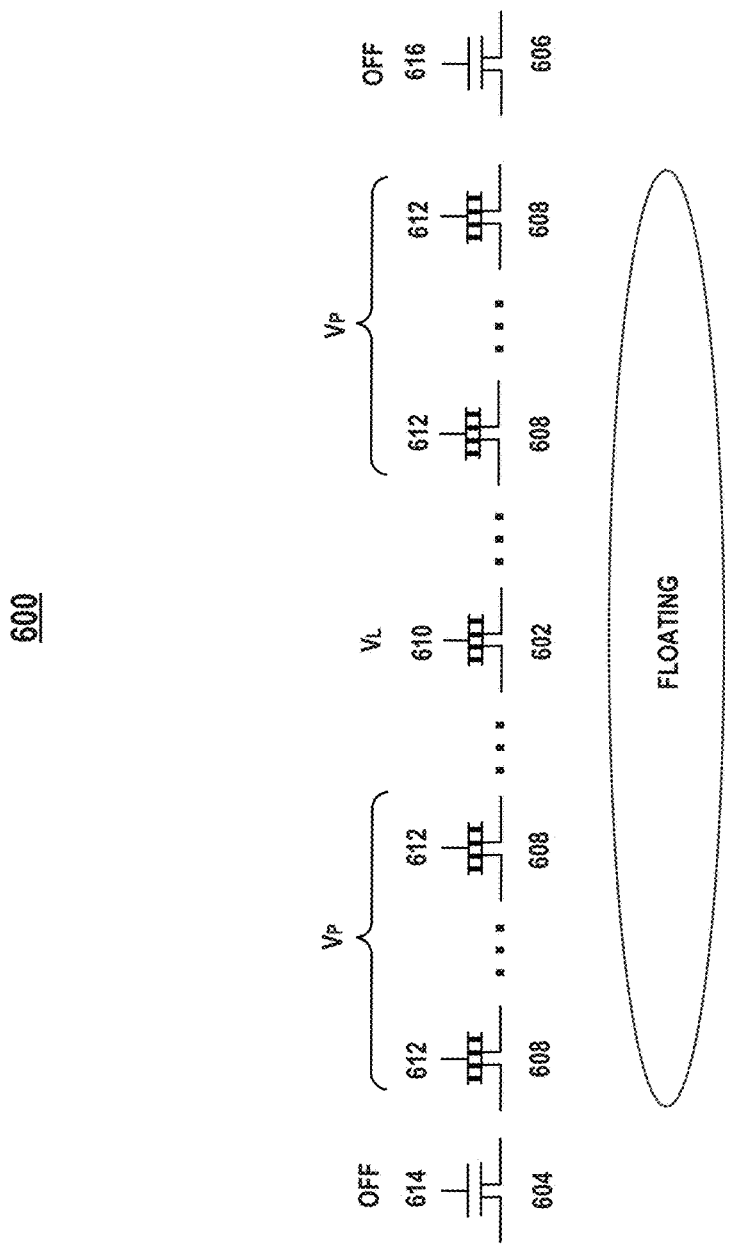
FIG. 6A illustrates a NGS operation on a memory cell in a string in an exemplary memory array device, according to some aspects of the present disclosure.
Figure 6B:
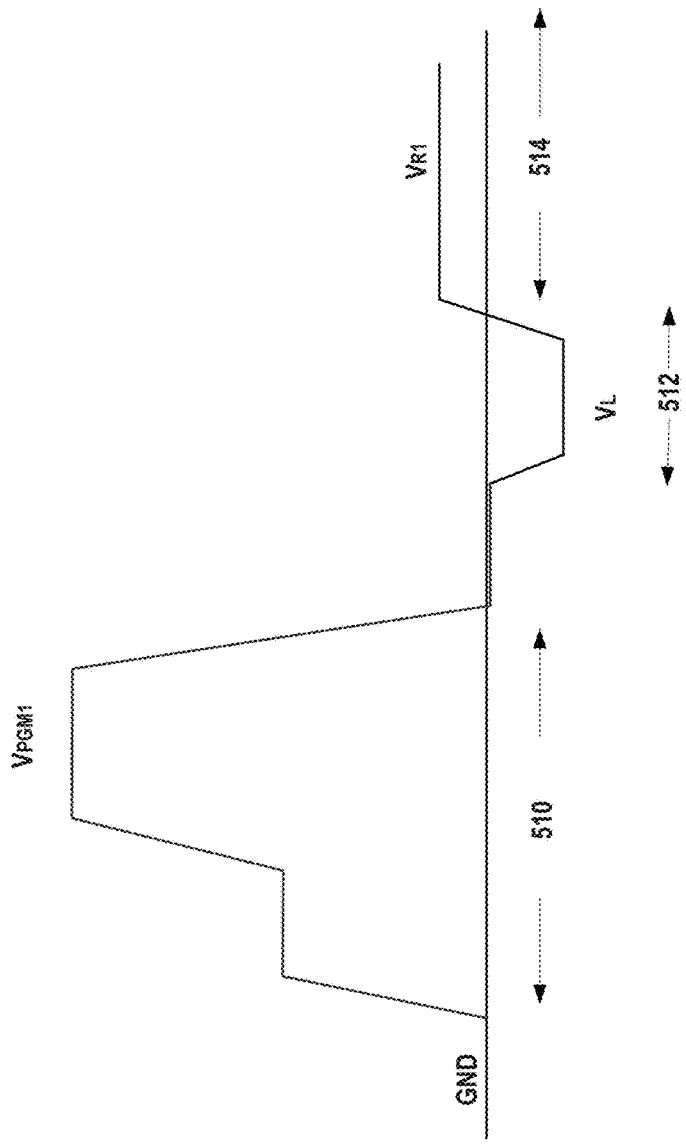
FIG. 6B illustrates a voltage waveform applied on a word line coupled to the memory cell in the NGS operation shown in FIG. 6A, according to some aspects of the present disclosure.

FIG. 6A illustrates a memory string 600 in an exemplary NGS operation, according to some implementations of the present disclosure. FIG. 6B illustrates an example of voltages applied on a selected word line in a program loop 506, according to some implementations of the present disclosure. For ease of illustration, FIGS. 6A and 6B are described together.

As shown in FIG. 6A, memory string 600 may include a plurality of memory cells arranged at respective cell depths, e.g., in the z-direction. Each of the memory cells may be coupled to a respective word line. For ease of illustration, a memory cell 602 is coupled to a selected word line 610, and memory cells 608 are each coupled to an unselected word line 612. Memory string 600 may also include a DSG transistor 604 at the upper end and an SSG transistor 606 at the lower end. DSG transistor 604 has a DSG (e.g., 312) that is coupled to a DSG line 614, and SSG transistor 606 has an SSG (e.g., 310) that is coupled to an SSG line 616. The DSG, the SSG, selected word line 610, DSG line 614, and SSG line 616 may be respective examples of DSG 312, SSG 310, selected word line 318, DSG line 313, and SSG line 315 illustrated in FIG. 3.

For each programming pass, 502 and 504, word lines 612 and 610 in the same block (e.g., block 304) may be sequentially applied with respective voltages from bottom to top or from top to bottom in the z-direction, e.g., in a direction from SSG transistor 606 to DSG transistor 604 or vice versa. When program loop 506 is performed on word line 610, programming operation 510 may include the word line driver (e.g., 208 in FIG. 2) applying programming voltage $V_{PGM1}$ on word line 610, i.e., the selected word line. Threshold voltages of memory cells coupled to word line 610 (e.g., memory cell 602) may be programmed to higher data states. After programming operation 510, NGS operation 512 may be enabled on all memory cells coupled to word line 610 (e.g., memory cell 602). NGS operation 512 may include the word line driver applying low voltage $V_L$ on word line 610 and applying a high voltage $V_P$ on word lines 612. Low voltage $V_L$ may be $V_{SS}$/GND or a negative voltage applied on memory cells coupled to word line 610 (e.g., memory cell 602). High voltage $V_P$ may be a sufficiently high positive voltage that keeps memory cells 608 on during NGS operation 512. In some implementations, $V_P$ is higher than $V_{DD}$. After NGS operation 512, verify operation 514 may be performed on memory cells coupled to word line 610 (e.g., memory cell 602). Verify operation 514 may include the word line driver applying verify voltages $V_{R1}$ on word line 610 to test if threshold voltages of any memory cells coupled to word line 610 have been successfully programmed into the higher data states.

NGS operation 512 may function as a "shallow etch" to remove at least some shallowly-trapped charges in all memory cells coupled to word line 610 (e.g., memory cell 602). Specifically, to enable NGS operation 512 on memory cell 602, memory string 600, which memory cell 602 is located, is configured to be at a "floating" state and undergoes a potential boost, in which the potential of memory string 600 increases. In the present disclosure, to set memory string 600 to the "floating" state, DSG transistor 604 and SSG transistor 606 are both turned off. Specifically, the value of $V_L$ is sufficiently low to ensure the value of the voltage on DSG line 614 minus the voltage on the bit line (e.g., 316) is below the threshold voltage of DSG transistor 604. DSG transistor 604 is thus turned off for both memory cells passed and did not pass the verify operations. As such, the NGS operation can be enabled on both memory cells passed and did not pass the verify operations. Different from a known NGS operation, which is only enabled on memory cells that coupled to a selected word line and did not pass respective verify operations, NGS operation 512 is enabled on all memory cells coupled to a selected word line, e.g., word line 610, when the word line 610 is being programmed in program loop 506.

Referring back to FIG. 4B, as an example, memory string 600 may be located in finger 436A. Memory cell 602 may or may not pass a respective verify operation immediately prior to the NGS operation 512. If memory cell 602 passed the verify operation, in some implementations, to enable NGS operation 512 on memory cell 602, memory string 600 is set to be "floating" by applying a turn-off voltage on DSG transistor 604 via DSG line 614 of the respective finger, applying a turn-off voltage on SSG transistor 606 via SSG line 616 of the respective finger, and applying a low voltage on the bit line (not shown) coupled to memory string 600. If memory cell 602 did not pass the verify operation, in some implementations, to enable NGS operation 512 on memory cell 602, memory string 600 is set to be "floating" by applying a turn-off voltage on DSG transistor 604 via DSG line 614 of the respective finger, applying a turn-off voltage on SSG transistor 606 via SSG line 616 of the respective finger, and applying a high voltage on the bit line (not shown) coupled to memory string 600. That is, even if finger 436A includes memory cells coupled to word line 610 and did not pass a respective verify operation immediately prior to the NGS operation 512 when word line 610 is selected for programming, DSG transistors 604 of all the memory strings in the finger are turned off to enable NGS operations 512 in all memory cells coupled to word line 610 (e.g., including memory cell 602). In some implementations, a turn-off voltage includes a low voltage or a negative voltage, and a turn-on voltage includes a positive voltage. In some implementations, the turn-off voltage is $V_{SS}$/GND, and the turn-on voltage is $V_{DD}$. Meanwhile, low voltage $V_L$ may be applied on memory cell 602 via word line 610, and high voltage $V_P$ may be applied on memory cells 608 via word lines 612. In some implementations, low voltage $V_L$ includes one of $V_{SS}$ and a negative voltage, and high voltage $V_P$ includes a positive voltage higher than $V_{DD}$.

Figure 7A:
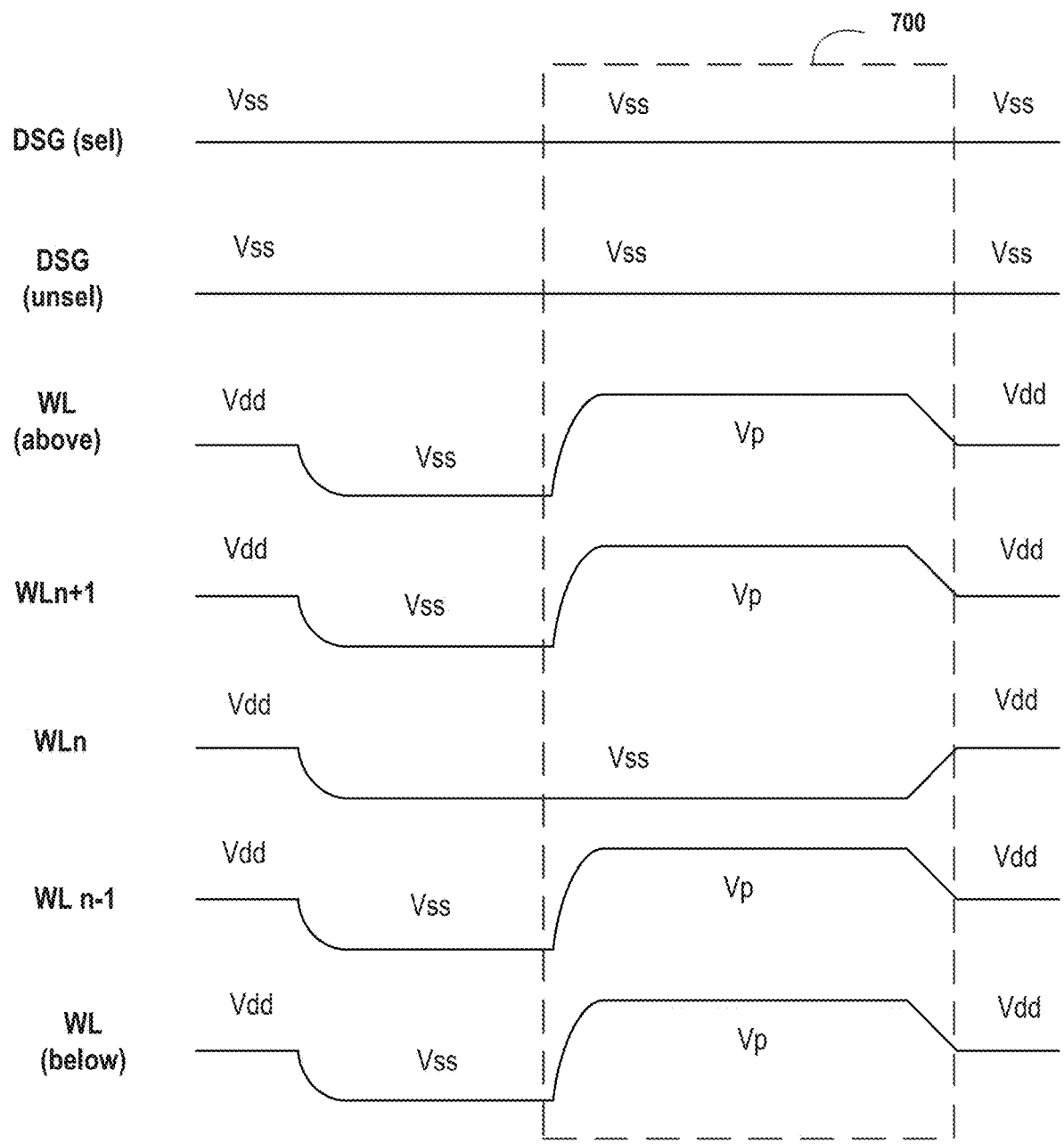
FIG. 7A illustrates exemplary voltage waveforms applied on word lines coupled to memory cells and select gate transistors in an exemplary NGS operation in a non-last programming pass, according to some aspects of the present disclosure.
Figure 7B:
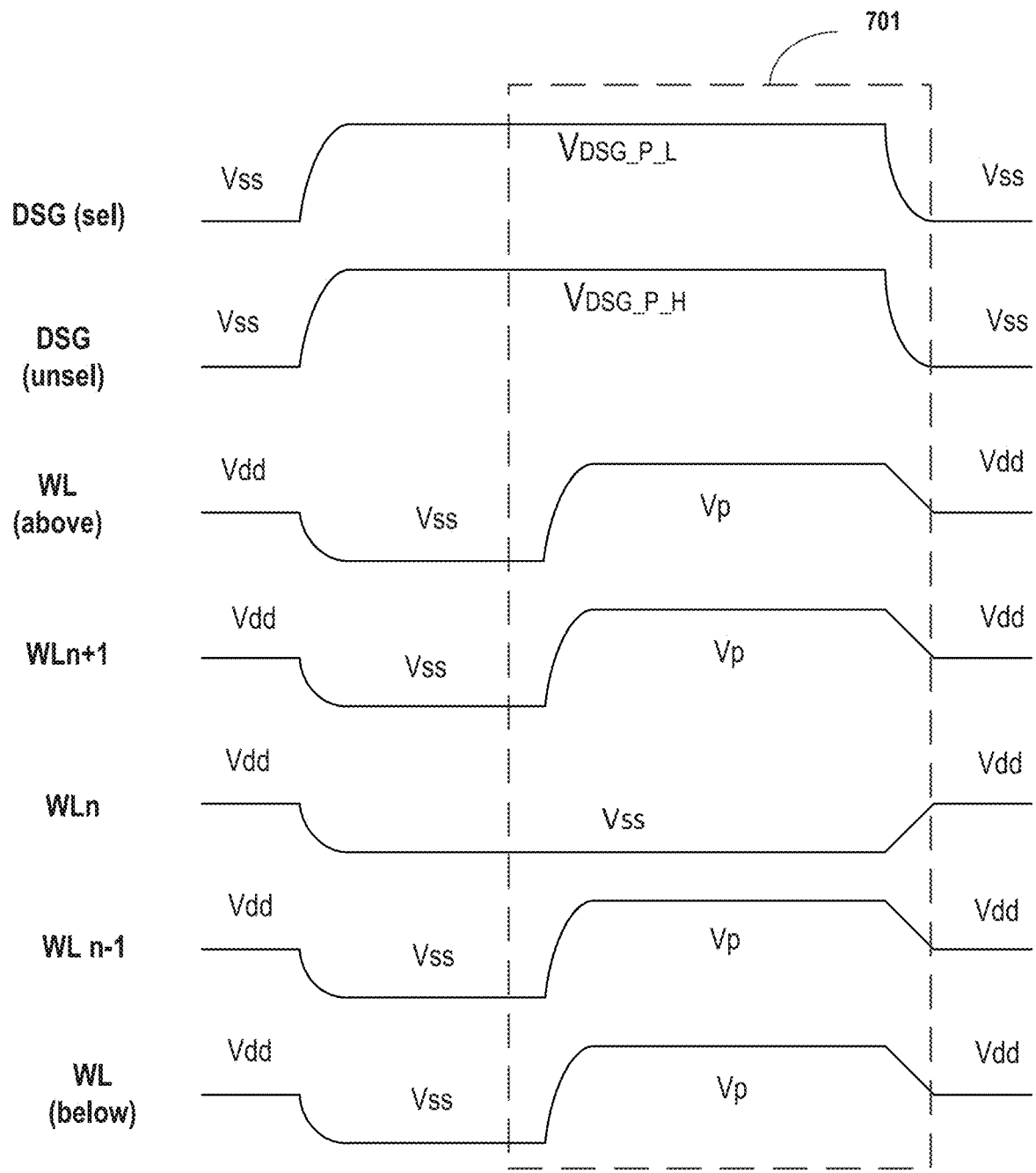
FIG. 7B illustrates exemplary voltage waveforms applied on word lines coupled to memory cells and select gate transistors in a known NGS operation, according to some aspects of the present disclosure.

FIG. 7A illustrates exemplary waveforms of voltages applied on certain elements of memory string 600 in NGS operation 512 in program loop 506, according to some implementations. FIG. 7B illustrates waveforms of voltages applied on certain elements of memory string 600 in a NGS operation in program loop 508, according to some implementations. In various implementations, voltages shown in FIG. 7A are applied in a non-last programming pass, and voltages shown in FIG. 7B can be applied in a non-last programming pass or the last programming pass. In some implementations, NGS operations are inhibited in program loop 508, as referring back to FIG. 5C and related description.

As shown in FIGS. 7A and 7B, waveforms of voltages applied on DSG line 614 and word lines 610 and 612 are illustrated. The NGS operations may be enabled at phases 700 and 701, respectively. In some implementations, DSG line 614 and word lines 610 and 612 are ramped up from initial voltages to respective voltages in phase 700/701 such that the NGS operations can be enabled. WLn represents the selected word line that is being programmed. WLn+1 represents the word line immediately above WLn in the z-direction. WL(above) represents all other word lines above WLn+1. WLn−1 represents the word line immediately below WLn in the z-direction. WL(below) represents all other word lines below WLn+1. DSG (sel) represents the waveform of voltages applied on DSG of a finger having memory cells coupled to WLn and not passed a respective verify operation immediately prior to the NGS operation. DSG (unsel) represents the waveform of voltages applied on DSG of a finger having memory cells coupled to WLn and all passed a respective verify operation immediately prior to the NGS operation.

As shown in FIG. 7A, in phase 700, WLn (e.g., 610) is being programmed and is applied with a low voltage. DSG line 614 may be applied with a low voltage such that DSG transistors of all memory strings in a finger WLn extends laterally may be turned off. In some implementations, the low voltage is $V_{SS}$/GND. In the meantime, other word lines 612 above and below WLn (e.g., WLn−1, WL(above), WLn+1, WL(below)) are each applied with a high voltage. In some embodiments, other word lines are applied with a positive voltage of $V_P$. In some implementations, $V_P$ is higher than $V_{DD}$.

Different from NGS operation 512, the NGS operation illustrated in FIG. 7B may be enabled only on memory cells coupled to WLn and did not pass the respective verify operations immediately prior to the NGS operation. For example, if memory cell 602 did not pass the verify operation, DSG line 614 may be applied with a voltage of $V_{DSG\_P\_L}$; and if memory cell 602 passed the verify operation, DSG line 614 may be applied with a voltage of $V_{DSG\_P\_H}$. In some embodiments, $V_{DSG\_P\_L}$ and $V_{DSG\_P\_H}$ are each a positive voltage, and $V_{DSG\_P\_H}$ is higher than $V_{DSG\_P\_L}$. As described above, in the NGS operation, the bit line of the memory string having memory cells coupled with WLn and did not pass the verify operation may be applied with a high voltage, e.g., $V_{DD}$; and the bit line of the memory string having memory cells in the selected word line and all passed the verify operation may be applied with a low voltage, e.g., $V_{SS}$. The value of $V_{DSG\_P\_L}$ minus $V_{DD}$ is lower than the threshold voltage of the DSG transistor such that the DSG transistor is turned off, enabling the NGS operation on memory cells coupled with word line 610 and did not pass the respective verify operations. The value of $V_{DSG\_P\_H}$ minus $V_{DD}$ is higher than the threshold voltage of the DSG transistor such that the DSG transistor is turned on, inhibiting the NGS operation on memory cells coupled with word line 610 and passed the respective verify operations.

FIG. 8 is a flowchart of an exemplary method 800 for operating a memory device, according to some implementations of the present disclosure. Examples of the memory device depicted in FIG. 8 include memory devices 104 depicted in FIG. 1A. For ease of illustration, FIG. 8 may be described in view of operations illustrated in FIGS. 3, 5A-5C, 6A, 6B, 7A, and 7B. It is understood that the operations shown in method 800 are not exhaustive and that other operations can be performed as well before, after, or between any of the illustrated operations. Further, some of the operations may be performed simultaneously, or in a different order than shown in FIG. 8. In some implementations, method 800 is performed by peripheral circuits 302. Specifically, the word line driver (e.g., 208) may be configured to apply voltages on the word lines, the DSG line, and the SSG line, and bit line driver (e.g., 206) may be configured to apply voltages on the bit lines.

Referring to FIG. 8, method 800 starts at operation 802, in which a non-last programming pass is performed on a selected word line. The non-last programming pass includes one or more program loops. At least one of the program loops includes a programming operation, a NGS operation after the programming operation, and a verify operation after the NGS operation.

Referring back to FIGS. 5A-5C, 6A, 6B, 7A, and 7B, a non-last programming pass, e.g., 502, may be performed on a selected word line, e.g., 610/WLn. The non-last programming pass may include one or more program loops, e.g., 506. At least one of the program loops includes a programming operation (e.g., 510), a NGS operation (e.g., 512) after the programming operation, and a verify operation (e.g., 514) after the NGS operation. The programming operation is first performed by applying a program voltage/pulse (e.g., $V_{PGM1}$) on the selected word line. The NGS operation may be enabled in one or more program loops 506 (e.g., each program loop 506). To enable the NGS operation, DSGs (e.g., 614) in fingers that include the memory cells coupled to the selected word line are each applied with a low voltage, e.g., $V_{SS}$, as illustrated in FIG. 7A. Bit lines of memory strings having memory cells not passed the verify operation and passed the verify operation are respectively applied with a high voltage (e.g., $V_{DD}$) and a low voltage ($V_{SS}$). The SSGs (e.g., 616) in the fingers are applied with a low voltage, e.g., $V_{SS}$. The DSG transistors and the SSG transistors in the fingers may both be turned off. In the meantime, a low voltage, GND or negative voltage, is applied on the selected word line, and a positive voltage is applied on the word lines above and below the selected word line, as illustrated in FIGS. 6B and 7A. In some implementations, all memory cells coupled with the selected word line each undergoes a respective NGS operation. The verify operation may be performed on the memory cells coupled to the selected word line after the NGS operation by applying one or more verify voltages (e.g., $V_{R1}$) on the selected word line.

In some implementations, the NGS operation is enabled in each program loop in the non-last programming pass. In some implementations, if the program loop is the first program loop, e.g., before any verify operations is performed, each memory cells coupled to the selected word line is treated as a memory cell that did not pass a respective verify operation prior to the NGS operation.

Referring back to FIG. 8, method 800 proceeds to operation 804, in which a last programming pass is performed on the selected word line. The last programming pass includes one or more program loops. The program loops may not include any NGS operations or include NGS operations enabled only on memory cells that did not pass respective verify operations immediately prior to the NGS operations.

Referring back to FIGS. 5A-5C, 6A, 6B, 7A, and 7B, a last programming pass, e.g., 504, may be performed on the selected word line, e.g., 610/WLn. The last programming pass may include one or more program loops, e.g., 508. Different from the program loop in the non-last programming pass, the programming loop may not include any NGS operations on any memory cells or may include NGS operations enabled only on memory cells that did not pass respective verify operations immediately prior to the NGS operations. In some implementations, the NGS operations are not enabled on memory cells that passed the verify operations. In some implementations, NGS operation is inhibited between the programming operation (e.g., 520) and the following verify operation (524), as shown in FIG. 5C. In some implementations, a NGS operation is enabled between the programming operation and the following verify operation, only on memory cells coupled to the selected word line and did not pass respective verify operations immediately prior to the NGS operations. The NGS operation may be enabled in one or more program loops 508. The programming operations and the verify operation may be referred to the description of FIG. 5C and the detailed descriptions are not repeated herein. To inhibit the NGS operation on the memory cells coupled to the selected word line and passed the verify operations, DSGs (e.g., 614) in fingers that include these memory cells are each applied with a low positive voltage (e.g., $V_{DSG\_P\_L}$), as illustrated in FIG. 7B. To enable the NGS operation on the memory cells coupled to the selected word line and did not pass the verify operations, DSGs (e.g., 614) in fingers that include these memory cells are each applied with a high positive voltage (e.g., $V_{DSG\_P\_H}$), as illustrated in FIG. 7B. Bit lines of memory strings having memory cells not passed the verify operation and passed the verify operation are respectively applied with a high voltage (e.g., $V_{DD}$) and a low voltage (e.g., $V_{SS}$). The SSGs (e.g., 616) in the fingers are applied with a low voltage and are turned off. In the meantime, a low voltage, e.g., negative or GND voltage, is applied on the selected word line, and a positive voltage is applied on the word lines above and below the selected word line, as illustrated in FIGS. 6B and 7A. The verify operation may be performed on the memory cells coupled to the selected word line after the NGS operation by applying one or more verify voltages (e.g., $V_{R2}$) on the selected word line. In some implementations, operation 804 is performed by peripheral circuits 302. It should be noted that, in various implementations, the verify operations (e.g., 514 and/or 524) may not be performed in all program loops.

Implementations of the present disclosure provide a memory device. The memory device includes an array of memory cells arranged in a plurality of rows, a plurality of word lines respectively coupled to the plurality of rows of the memory cells, and a peripheral circuit coupled to the word lines and configured to perform multi-pass programming on a selected row of memory cells coupled to a selected word line of the word lines. The multi-pass programming includes a plurality of programming passes. Each of the programming passes includes a programming operation and a verify operation. To perform the multi-pass programming, the peripheral circuit is configured to, in a non-last programming pass, perform a NGS operation on each memory cell in the selected row of memory cells between the programming operation and the verify operation.

In some implementations, the peripheral circuit includes a word line driver coupled to the plurality of word lines. In some implementations, to perform the NGS operation on the selected row of memory cells, the word line driver is configured to apply one of a negative voltage or GND voltage on the selected word line.

In some implementations, to perform the NGS operation on the selected row of memory cells, the word line driver is further configured to apply a positive voltage on a rest of the word lines.

In some implementations, the memory device further includes a plurality of bit lines. The array of memory cells includes a plurality of strings coupled to the plurality of bit lines, the strings each comprising a DSG transistor and a SSG transistor. The memory cells in the selected row are in a plurality of strings, respectively. To perform the NGS operation on the selected row of memory cells, the peripheral circuit is further configured to turn off the DSG transistor and the SSG transistor of each of the strings.

In some implementations, the peripheral circuit includes a bit line driver coupled to the plurality of bit lines and the word line driver is coupled to the DSG transistor via a DSG line. To turn off the DSG transistor of each of the strings, the bit line driver is configured to apply, of each of the strings, a bit line voltage on the respective bit line; and the word line driver is configured to apply, of each of the strings, a DSG voltage on the DSG transistor via the DSG line. A value of the DSG voltage minus the bit line voltage is lower than a threshold voltage of the DSG transistor.

In some implementations, the DSG voltage is a GND voltage.

In some implementations, in response to the row of memory cells having a memory cell not passing a respective verify operation immediately prior to the NGS operation, the bit line voltage is a positive voltage.

In some implementations, in response to the row of memory cells having a memory cell passing a respective verify operation immediately prior to the NGS operation, the bit line voltage is a GND voltage.

In some implementations, the peripheral circuit includes an SSG line coupled to the SSG transistor of each of the strings and a source driver coupled to the SSG line. The source driver is configured to apply a GND voltage on the SSG line.

In some implementations, to perform the multi-pass programming, the peripheral circuit is configured to, in a last programming pass, in response to one of the memory cells in the selected row passing a respective verify operation immediately prior to the last programming pass, inhibit a respective NGS operation on the one of the memory cells. In response to another one of the memory cells in the selected row not passing a respective verify operation immediately prior to the last programming pass, the peripheral circuit is configured to, in a last programming pass, perform a respective NGS operation on the other one of the memory cells.

In some implementations, to perform the multi-pass programming, the peripheral circuit is configured to, in the last programming pass, inhibit a respective NGS on each of the memory cells in the selected row of memory cells.

In some implementations, the NGS operation is performed between a respective programming operation and a respective verify operation.

In some implementations, the non-last programming pass includes a plurality of programming operations and a plurality of verify operations, and the NGS operation is performed after each of the programming operations and before a respective verify operation.

In some implementations, the memory device is a three-dimensional NAND Flash memory device.

Implementations of the present disclosure provide a method for operating a memory device comprising an array of memory cells arranged in a plurality of rows and a plurality of word lines respectively coupled to the plurality of rows of the memory cells. The method includes performing multi-pass programming on a selected row of memory cells, the multi-pass programming comprising a plurality of programming passes. Each of the programming passes includes a programming operation and a verify operation. Performing the multi-pass programming includes, in a non-last programming pass, performing a NGS operation on each memory cell in the selected row of memory cells between the programming operation and the verify operation.

In some implementations, performing the NGS operation on the selected row of memory cells includes applying one of a negative voltage or a GND voltage on a selected word line coupled to the selected row of memory cells.

In some implementations, performing the NGS operation on the selected row of memory cells includes applying a positive voltage on a rest of the word lines.

In some implementations, the memory device includes a plurality of bit lines, the array of memory cells comprising a plurality of strings coupled to the plurality of bit lines, the strings each comprising a DSG transistor and a SSG transistor. The memory cells in the selected row are in a plurality of strings, respectively. The method includes turning off the DSG transistor and the SSG transistor of each of the strings.

In some implementations, the method further includes applying a bit line voltage on the respective bit line; and applying a DSG voltage on the DSG transistor via a DSG line. A value of the DSG voltage minus the bit line voltage is lower than a threshold voltage of the DSG transistor.

In some implementations, the DSG voltage is a GND voltage.

In some implementations, the method further includes, in response to the row of memory cells comprising a memory cell not passing a respective verify operation immediately prior to the NGS operation, applying a positive voltage as the bit line voltage.

In some implementations, the method further includes, in response to the row of memory cells comprising a memory cell passing a respective verify operation immediately prior to the NGS operation, applying a GND voltage as the bit line voltage.

In some implementations, the method further includes applying a GND voltage on the SSG transistor.

In some implementations, the method further includes, in a last programming pass, in response to one of the memory cells in the selected row passing a respective verify operation immediately prior to the last programming pass, inhibiting a respective NGS operation on the one of the memory cells. In some implementations, the method further includes, in a last programming pass, in response to another one of the memory cells in the selected row not passing a respective verify operation immediately prior to the last programming pass, performing a respective NGS operation on the other one of the memory cells.

In some implementations, the method further includes, in the last programming pass, inhibiting a respective NGS on each of the memory cells in the selected row of memory cells.

In some implementations, the method includes performing the NGS operation between a respective programming operation and a respective verify operation.

In some implementations, the non-last programming pass includes a plurality of programming operations and a plurality of verify operations, and the method includes performing NGS operation after each of the programming operations and before a respective verify operation.

Implementations of the present disclosure provide a system. The system includes a memory device configured to store data and a memory controller coupled to the memory device and configured to control the memory device. The memory device includes an array of memory cells arranged in a plurality of rows, a plurality of word lines respectively coupled to the plurality of rows of the memory cells, and a peripheral circuit coupled to the word lines and configured to perform multi-pass programming on a selected row of memory cells coupled to a selected word line of the word lines. The multi-pass programming includes a plurality of programming passes. Each of the programming passes includes a programming operation and a verify operation. To perform the multi-pass programming, the peripheral circuit is configured to, in a non-last programming pass, perform a NGS operation on each memory cell in the selected row of memory cells between the programming operation and the verify operation.

In some implementations, the system further includes a host coupled to the memory controller.

In some implementations, the peripheral circuit includes a word line driver coupled to the plurality of word lines. To perform the NGS operation on the selected row of memory cells, the word line driver is configured to apply one of a negative voltage or a GND voltage on the selected word line.

In some implementations, to perform the NGS operation on the selected row of memory cells, the word line driver is further configured to apply a positive voltage on a rest of the word lines.

In some implementations, the memory device further includes a plurality of bit lines. The array of memory cells includes a plurality of strings coupled to the plurality of bit lines, and the strings each includes a DSG transistor and a SSG transistor. The memory cells in the selected row are in a plurality of strings, respectively. To perform the NGS operation on the selected row of memory cells, the peripheral circuit is further configured to turn off the DSG transistor and the SSG transistor of each of the strings.

In some implementations, the peripheral circuit includes a bit line driver coupled to the plurality of bit lines and the word line driver is coupled to the DSG transistor via a DSG line. To turn off the DSG transistor of each of the strings, the bit line driver is configured to apply, of each of the strings, a bit line voltage on the respective bit line. The word line driver is configured to apply, of each of the strings, a DSG voltage on the DSG transistor via the DSG line, a value of the DSG voltage minus the bit line voltage being lower than a threshold voltage of the DSG transistor.

In some implementations, the DSG voltage is a GND voltage.

In some implementations, in response to the row of memory cells having a memory cell not passing a respective verify operation immediately prior to the NGS operation, the bit line voltage is a positive voltage.

In some implementations, in response to the row of memory cells having a memory cell passing a respective verify operation immediately prior to the NGS operation, the bit line voltage is a GND voltage.

In some implementations, the peripheral circuit includes an SSG line coupled to the SSG transistor of each of the strings and a source driver coupled to the SSG line. The source driver is configured to apply a GND voltage on the SSG line.

In some implementations, to perform the multi-pass programming, the peripheral circuit is configured to, in a last programming pass, in response to one of the memory cells in the selected row passing a respective verify operation immediately prior to the last programming pass, inhibit a respective NGS operation on the one of the memory cells. In some implementations, to perform the multi-pass programming, the peripheral circuit is configured to, in response to another one of the memory cells in the selected row not passing a respective verify operation immediately prior to the last programming pass, perform a respective NGS operation on the other one of the memory cells.

In some implementations, to perform the multi-pass programming, the peripheral circuit is configured to, in the last programming pass, inhibit a respective NGS on each of the memory cells in the selected row of memory cells.

In some implementations, the NGS operation is performed between a respective programming operation and a respective verify operation.

In some implementations, the non-last programming pass includes a plurality of programming operations and a plurality of verify operations, and the NGS operation is performed after each of the programming operations and before a respective verify operation.

In some implementations, the memory device is a three-dimensional NAND Flash memory device.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
an array of memory cells arranged in a plurality of rows;
a plurality of word lines respectively coupled to the plurality of rows of the memory cells; and
a peripheral circuit coupled to the word lines and configured to perform multi-pass programming on a selected row of memory cells coupled to a selected word line of the word lines, the multi-pass programming comprising a plurality of programming passes, each of the programming passes comprising a programming operation and a verify operation, wherein, to perform the multi-pass programming, the peripheral circuit is configured to,
in a non-last programming pass, perform a negative gate stress (NGS) operation on each memory cell in the selected row of memory cells between the programming operation and the verify operation.

2. The memory device of claim 1, wherein the peripheral circuit comprises a word line driver coupled to the plurality of word lines, and wherein to perform the NGS operation on the selected row of memory cells, the word line driver is configured to apply one of a negative voltage or a ground (GND) voltage on the selected word line.

3. The memory device of claim 2, wherein to perform the NGS operation on the selected row of memory cells, the word line driver is further configured to apply a positive voltage on a rest of the word lines.

4. The memory device of claim 2, further comprising a plurality of bit lines, wherein:
the array of memory cells comprises a plurality of strings coupled to the plurality of bit lines, the strings each comprising a drain-select gate (DSG) transistor and a source-select gate (SSG) transistor;
the memory cells in the selected row are in a plurality of strings, respectively; and to perform the NGS operation on the selected row of memory cells, the peripheral circuit is further configured to turn off the DSG transistor and the SSG transistor of each of the strings.

5. The memory device of claim 4, wherein the peripheral circuit comprises a bit line driver coupled to the plurality of bit lines and the word line driver is coupled to the DSG transistor via a DSG line, and wherein to turn off the DSG transistor of each of the strings,
the bit line driver is configured to apply, of each of the strings, a bit line voltage on the respective bit line; and
the word line driver is configured to apply, of each of the strings, a DSG voltage on the DSG transistor via the DSG line, a value of the DSG voltage minus the bit line voltage being lower than a threshold voltage of the DSG transistor.

6. The memory device of claim 5, wherein the DSG voltage is a GND voltage.

7. The memory device of claim 4, wherein, in response to the row of memory cells comprising a memory cell not passing a respective verify operation immediately prior to the NGS operation, the bit line voltage is a positive voltage.

8. The memory device of claim 4, wherein, in response to the row of memory cells comprising a memory cell passing a respective verify operation immediately prior to the NGS operation, the bit line voltage is a GND voltage.

9. The memory device of claim 1, wherein, to perform the multi-pass programming, the peripheral circuit is configured to, in a last programming pass:
in response to one of the memory cells in the selected row passing a respective verify operation immediately prior to the last programming pass, inhibit a respective NGS operation on the one of the memory cells; and
in response to another one of the memory cells in the selected row not passing a respective verify operation immediately prior to the last programming pass, perform a respective NGS operation on the other one of the memory cells.

10. The memory device of claim 1, wherein, to perform the multi-pass programming, the peripheral circuit is configured to, in the last programming pass, inhibit a respective NGS on each of the memory cells in the selected row of memory cells.

11. The memory device of claim 1, wherein the NGS operation is performed between a respective programming operation and a respective verify operation.

12. The memory device of claim 1, wherein the memory device is a three-dimensional NAND Flash memory device.

13. A method for operating a memory device comprising an array of memory cells arranged in a plurality of rows and a plurality of word lines respectively coupled to the plurality of rows of the memory cells, the method comprising:
performing multi-pass programming on a selected row of memory cells, the multi-pass programming comprising a plurality of programming passes, each of the programming passes comprising a programming operation and a verify operation, wherein performing the multi-pass programming comprises:
in a non-last programming pass, performing a negative gate stress (NGS) operation on each memory cell in the selected row of memory cells between the programming operation and the verify operation.

14. The method of claim 13, wherein performing the NGS operation on the selected row of memory cells comprises applying one of a negative voltage or a ground (GND) voltage on a selected word line coupled to the selected row of memory cells.

15. The method of claim 14, wherein performing the NGS operation on the selected row of memory cells comprises applying a positive voltage on a rest of the word lines.

16. The method of claim 14, wherein the memory device comprises a plurality of bit lines, the array of memory cells comprising a plurality of strings coupled to the plurality of bit lines, the strings each comprising a drain-select gate (DSG) transistor and a source-select gate (SSG) transistor, the memory cells in the selected row being in a plurality of strings, respectively, the method comprising:

turning off the DSG transistor and the SSG transistor of each of the strings.

17. The method of claim 16, further comprising:

applying a bit line voltage on the respective bit line; and applying a DSG voltage on the DSG transistor via a DSG line, a value of the DSG voltage minus the bit line voltage being lower than a threshold voltage of the DSG transistor.

18. The method of claim 16, further comprising:

in response to the row of memory cells comprising a memory cell not passing a respective verify operation immediately prior to the NGS operation, applying a positive voltage as the bit line voltage.

19. The method of claim 16, further comprising:

in response to the row of memory cells comprising a memory cell passing a respective verify operation immediately prior to the NGS operation, applying a GND voltage as the bit line voltage.

20. A system, comprising:

a memory device configured to store data, the memory device comprising:

an array of memory cells arranged in a plurality of rows;

a plurality of word lines respectively coupled to the plurality of rows of the memory cells; and a peripheral circuit coupled to the word lines and configured to perform multi-pass programming on a selected row of memory cells coupled to a selected word line of the word lines, the multi-pass programming comprising a plurality of programming passes, each of the programming passes comprising a programming operation and a verify operation, wherein, to perform the multi-pass programming, the peripheral circuit is configured to, in a non-last programming pass, perform a negative gate stress (NGS) operation on each memory cell in the selected row of memory cells between the programming operation and the verify operation, and a memory controller coupled to the memory device and configured to control the memory device.

* * * * *